(12) United States Patent
Morita et al.

(10) Patent No.: US 11,258,976 B2
(45) Date of Patent: Feb. 22, 2022

(54) DIFFERENTIAL AMPLIFIER, PIXEL CIRCUIT AND SOLID-STATE IMAGING DEVICE

(71) Applicant: HAMAMATSU PHOTONICS K.K., Hamamatsu (JP)

(72) Inventors: Sho Morita, Hamamatsu (JP); Takayuki Kurashina, Hamamatsu (JP); Hiroo Yamamoto, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 16/754,239

(22) PCT Filed: Oct. 3, 2018

(86) PCT No.: PCT/JP2018/037089
§ 371 (c)(1),
(2) Date: Apr. 7, 2020

(87) PCT Pub. No.: WO2019/073883
PCT Pub. Date: Apr. 18, 2019

(65) Prior Publication Data
US 2020/0280694 A1    Sep. 3, 2020

(30) Foreign Application Priority Data

Oct. 11, 2017 (JP) .............................. JP2017-197591
Oct. 11, 2017 (JP) .............................. JP2017-197592

(51) Int. Cl.
*H04N 5/374* (2011.01)
*H04N 5/378* (2011.01)
(Continued)

(52) U.S. Cl.
CPC ..... *H04N 5/37457* (2013.01); *H03F 3/45179* (2013.01); *H03F 2200/129* (2013.01); *H03F 2203/45512* (2013.01)

(58) Field of Classification Search
CPC .. H04N 5/3745; H04N 5/37457; H04N 5/378; H03F 3/08; H03F 3/45;
(Continued)

(56) References Cited

U.S. PATENT DOCUMENTS 5,233,180 A * 8/1993 Tsuruta .................. H01J 10/14
250/208.1
5,440,272 A * 8/1995 Orisaka ..................... H03F 3/45
330/253
(Continued)

FOREIGN PATENT DOCUMENTS

EP    2797228 A    10/2014
JP    H4-120907 A    4/1992
(Continued)

OTHER PUBLICATIONS

International Preliminary Report On Patentability dated Apr. 23, 2020 for PCT/JP2018/037089.

*Primary Examiner* — Marly S Camargo
(74) *Attorney, Agent, or Firm* — Faegre Drinker Biddle & Reath LLP

(57) ABSTRACT

A pixel circuit includes a differential amplifier. The differential amplifier includes a non-inverting input terminal, an inverting input terminal, and an output terminal. The differential amplifier includes an input differential pair including first and second NMOS transistors, a current mirror pair including PMOS transistors, and a constant current source including a fifth NMOS transistor. A threshold voltage of each of the first and second NMOS transistors is higher than a threshold voltage of the fifth NMOS transistor. Further, the
(Continued)

threshold voltage of each of the first and second NMOS transistors is higher than a threshold voltage of another NMOS transistor.

17 Claims, 7 Drawing Sheets

(51) Int. Cl.
    *H03F 3/12*     (2006.01)
    *H03F 3/08*     (2006.01)
    *H03M 1/06*     (2006.01)
    *H01L 27/146*     (2006.01)
    *H04N 5/3745*     (2011.01)
    *H03F 3/45*     (2006.01)

(58) Field of Classification Search
CPC ......... H03F 2200/129; H03F 2200/474; H03F 2200/84; H03F 1/3211; H03F 3/082; H03F 2203/45512; H03M 1/0682; H03M 1/068; H01L 27/14641; H01L 31/14
USPC ............... 348/300, 301, 302, 308, 294, 297; 330/52, 253, 257, 264, 288, 285, 199; 327/52, 53, 54, 56, 61, 65, 66, 68, 127, 327/108, 132, 210, 330, 389, 437, 434, 327/490, 566; 257/291, 292, 69, 204, 257/288, 159, 391, 392, 402, 293; 250/208.1
See application file for complete search history.

(56) References Cited

U.S. PATENT DOCUMENTS

| | | | |
|---|---|---|---|
| 11,025,241 B2* | 6/2021 | Nakatsuka | H03K 5/2481 |
| 2004/0046209 A1 | 3/2004 | Sera et al. | |
| 2007/0229157 A1 | 10/2007 | Bhattacharya et al. | |
| 2011/0025420 A1* | 2/2011 | Sumi | H03G 3/00 330/378 |
| 2012/0019697 A1* | 1/2012 | Suzuki | H04N 5/335 348/308 |
| 2013/0300907 A1* | 11/2013 | Tanaka | H03M 1/34 348/308 |
| 2015/0155325 A1 | 6/2015 | Mabuchi et al. | |
| 2016/0381315 A1* | 12/2016 | Hagihara | H04N 5/3765 |
| 2020/0336683 A1* | 10/2020 | Kobuse | H04N 5/35536 |

FOREIGN PATENT DOCUMENTS

| | | |
|---|---|---|
| JP | H05-215602 A | 8/1993 |
| JP | H6-216666 A | 8/1994 |
| JP | H7-262785 A | 10/1995 |
| JP | H11-266398 A | 9/1999 |
| JP | 2004-266597 A | 9/2004 |

* cited by examiner

DIFFERENTIAL AMPLIFIER, PIXEL CIRCUIT AND SOLID-STATE IMAGING DEVICE

TECHNICAL FIELD

The present invention relates to a differential amplifier, a pixel circuit including the differential amplifier, and a solid-state imaging device including the pixel circuit.

BACKGROUND ART

In general, a solid-state imaging device includes a plurality of photodiodes arranged and formed in a one-dimensional or two-dimensional faun on a substrate, and a pixel circuit that receives and processes output signals from the plurality of photodiodes. Further, the pixel circuit includes an amplifier and an integration capacitive element. The pixel circuit receives a signal output from the photodiode, accumulates charges in the integration capacitive element, and outputs a voltage value according to an amount of accumulated charges from an output terminal of the amplifier.

A differential amplifier (see Patent Document 1) is used as the amplifier in the pixel circuit. In this case, a reference voltage is input to a first input terminal of the differential amplifier, and a signal from the photodiode is input to a second input terminal. In the differential amplifier, since the two input terminals are in an imaginary short relationship, a potential difference between the two input terminals is substantially zero. Therefore, since the photodiode can be driven with a substantially zero reverse bias voltage, it is possible to suppress a dark current. In this respect, it is preferable to use the differential amplifier in the pixel circuit.

In a solid-state imaging device, high integration of photodiodes is required in order to improve spatial resolution and achieve low price. That is, an increase in the number of photodiodes formed on a substrate and reduction in a pitch of pixels (reduction in an area of each photodiode) are required. In order to achieve the high integration, the solid-state imaging device may have a configuration in which a first substrate on which a plurality of photodiodes are formed and a second substrate on which a plurality of pixel circuits are formed are disposed to face each other. In particular, when photodiodes are formed on the first substrate made of a compound semiconductor and pixel circuits are formed on the second substrate made of silicon, the first substrate and the second substrate are separated from each other. In this case, high integration of the pixel circuits on the second substrate is also required together with high integration of the photodiodes on the first substrate. That is, reduction in a pitch of the pixel circuit on the second substrate (reduction in an area of a layout of each pixel circuit) is also required.

CITATION LIST

Patent Literature

Patent Document 1: Japanese Patent Application Laid-Open Publication No. H6-216666

SUMMARY OF INVENTION

Technical Problem

The present inventors have obtained the following knowledge in a process of conducting research on reduction in a pitch of a pixel circuit including a differential amplifier. That is, a magnitude of an output range of the differential amplifier is limited by a circuit configuration of the differential amplifier. In order to increase the output range, it may be possible to modify a circuit, such as to provide an output buffer after the differential amplifier as described in Patent Document 1. However, in this case, a circuit scale of the pixel circuit including the differential amplifier becomes large, which is contrary to the purpose of reduction in the pitch of the pixel circuit.

Further, it is necessary to manufacture the pixel circuit using a fine CMOS process in order to reduce the pitch of the pixel circuit. However, since a differential amplifier manufactured by the fine CMOS process is driven by a low power supply voltage, the output range of the differential amplifier is reduced accordingly.

The present invention has been made on the basis of the above knowledge of the present inventors, and an object thereof is to provide a differential amplifier, a pixel circuit, and a solid-state imaging device capable of reducing a pitch of the pixel circuit and suppressing decrease in an output range.

Solution to Problem

A differential amplifier according to the present invention is a differential amplifier including a first input terminal, a second input terminal, and an output terminal, and includes (1) an input differential pair including a first MOS transistor and a second MOS transistor of a first conductivity type, sources of the first MOS transistor and the second MOS transistor being connected to a common node, a gate of the first MOS transistor being connected to the first input terminal, and a gate of the second MOS transistor being connected to the second input terminal; (2) a current mirror pair including a third MOS transistor and a fourth MOS transistor of a second conductivity type, a first reference voltage being input to sources of the third MOS transistor and the fourth MOS transistor, a drain of the third MOS transistor being connected to a drain of the first MOS transistor, a drain of the fourth MOS transistor being connected to a drain of the second MOS transistor and the output terminal, and gates of the third MOS transistor and the fourth MOS transistor being connected to the drain of the third MOS transistor; and (3) a constant current source including a fifth MOS transistor of the first conductivity type, a second reference voltage being input to a source of the fifth MOS transistor, a drain of the fifth MOS transistor being connected to the common node, and a third reference voltage being input to a gate of the fifth MOS transistor, and (4) a threshold voltage of each of the first MOS transistor and the second MOS transistor is higher than a threshold voltage of the fifth MOS transistor.

Further, one of the first conductivity type and the second conductivity type is an N-type, and the other is a P-type. One of the first reference voltage and the second reference voltage is a power supply potential Vdd, and the other is a ground potential. The third reference voltage is a potential that is applied to the gate of the fifth MOS transistor in order to use the fifth MOS transistor as a constant current source.

A pixel circuit according to the present invention includes the differential amplifier of the above configuration; and an integration capacitive element provided between the second input terminal and the output terminal of the differential amplifier and for accumulating charges according to a signal input to the second input terminal, and a signal having a value according to an amount of accumulated charges in the integration capacitive element is output from the output terminal of the differential amplifier.

A solid-state imaging device according to the present invention includes the pixel circuit of the above configuration; and a photodiode, and the pixel circuit inputs a signal output according to light reception from the photodiode to the second input terminal of the differential amplifier, and outputs an output signal having a value according to an amount of received light from the output terminal of the differential amplifier.

A pixel circuit according to the present invention includes a differential amplifier including a first input terminal, a second input terminal, and an output terminal; and an integration capacitive element provided between the second input terminal and the output terminal of the differential amplifier and for accumulating charges according to a signal input to the second input terminal, the pixel circuit outputting a signal having a value according to an amount of accumulated charges in the integration capacitive element from the output terminal of the differential amplifier, and the differential amplifier includes (1) an input differential pair including a first MOS transistor and a second MOS transistor of a first conductivity type, sources of the first MOS transistor and the second MOS transistor being connected to a common node, a gate of the first MOS transistor being connected to the first input terminal, and a gate of the second MOS transistor being connected to the second input terminal; (2) a current mirror pair including a third MOS transistor and a fourth MOS transistor of a second conductivity type, a first reference voltage being input to sources of the third MOS transistor and the fourth MOS transistor, a drain of the third MOS transistor being connected to a drain of the first MOS transistor, a drain of the fourth MOS transistor being connected to a drain of the second MOS transistor and the output terminal, and gates of the third MOS transistor and the fourth MOS transistor being connected to the drain of the third MOS transistor; and (3) a constant current source including a fifth MOS transistor of the first conductivity type, a second reference voltage being input to a source of the fifth MOS transistor, a drain of the fifth MOS transistor being connected to the common node, and a third reference voltage being input to a gate of the fifth MOS transistor, and (4) a threshold voltage of each of the first MOS transistor and the second MOS transistor is higher than a threshold voltage of another MOS transistor of the first conductivity type other than the fifth MOS transistor included in the pixel circuit.

Further, one of the first conductivity type and the second conductivity type is an N-type, and the other is a P-type. One of the first reference voltage and the second reference voltage is a power supply potential Vdd, and the other is a ground potential. The third reference voltage is a potential that is applied to the gate of the fifth MOS transistor in order to use the fifth MOS transistor as a constant current source.

A solid-state imaging device according to the present invention includes the pixel circuit of the above configuration; and a photodiode, and the pixel circuit inputs a signal output according to light reception from the photodiode to the second input terminal of the differential amplifier, and outputs an output signal having a value according to an amount of received light from the output terminal of the differential amplifier.

Advantageous Effects of Invention

According to the present invention, it is possible to reduce a pitch of the pixel circuit and to suppress decrease in the output range of the differential amplifier.

DESCRIPTION OF EMBODIMENTS

Hereinafter, embodiments for carrying out the present invention will be described in detail with reference to the accompanying drawings. In the description of the drawings, the same elements will be denoted by the same reference signs, without redundant description. The present invention is not limited to these examples.

Figure 1:
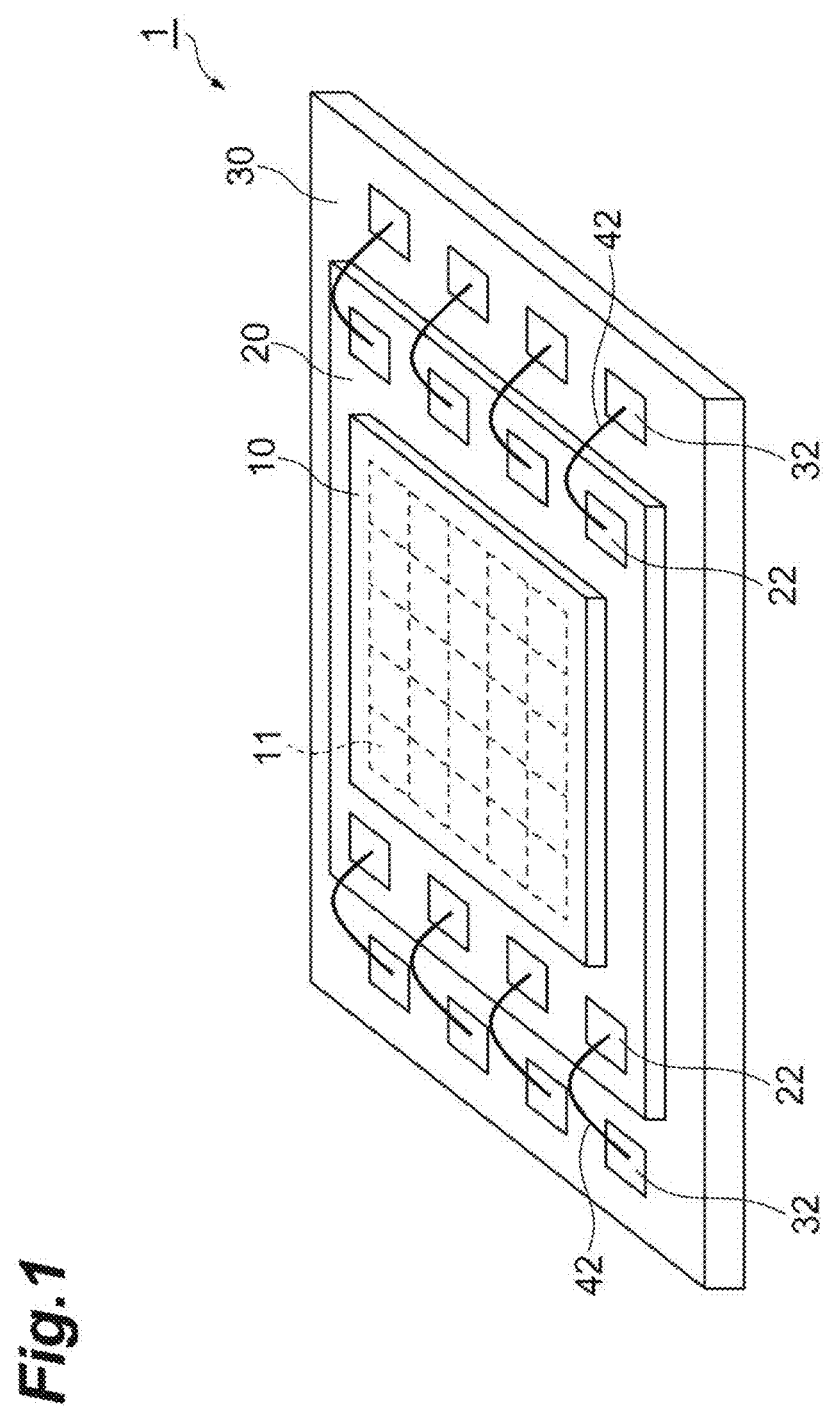
FIG. 1 is a perspective view illustrating a configuration of a solid-state imaging device 1.
Figure 2:
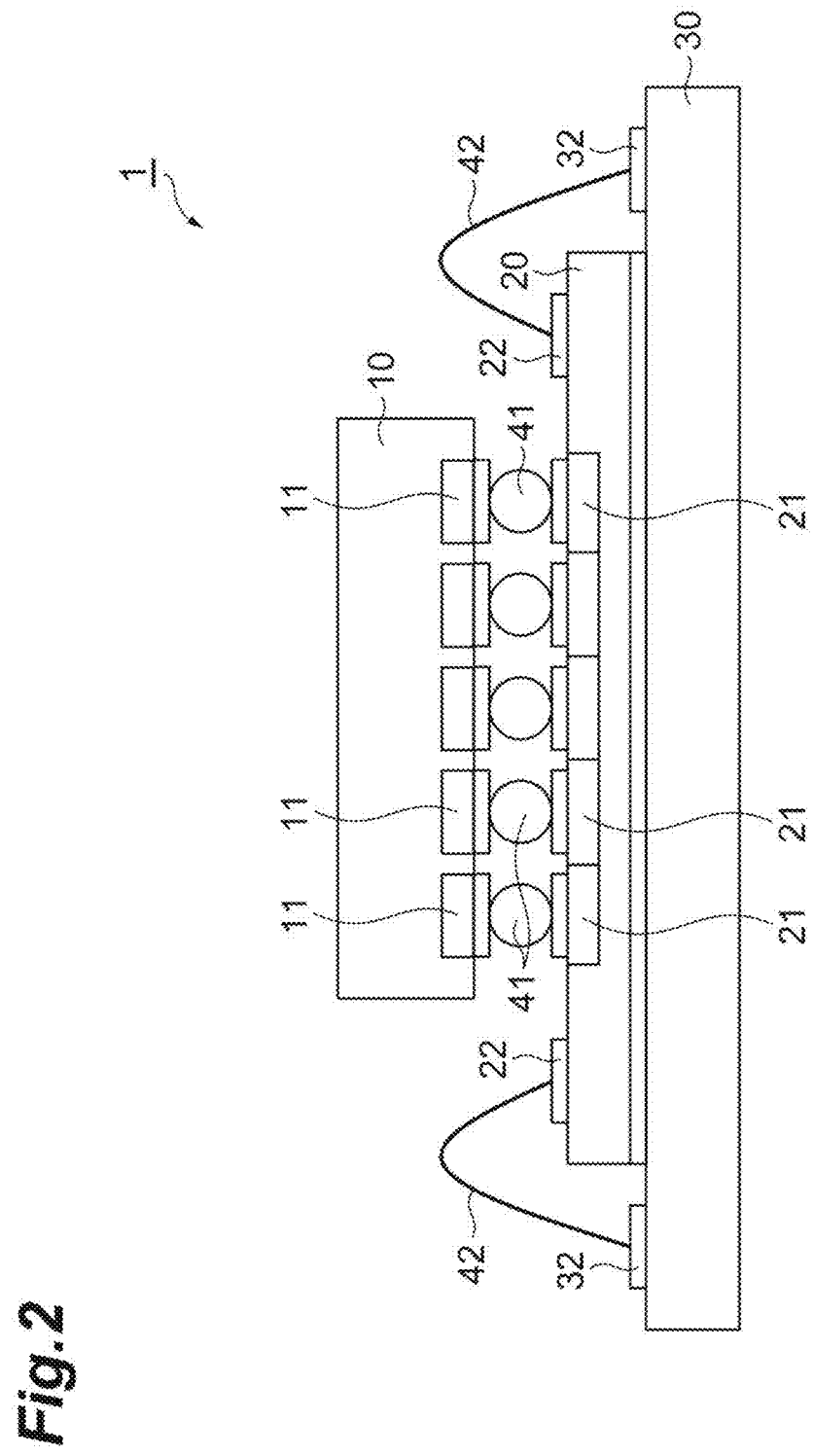
FIG. 2 is a cross-sectional view illustrating the configuration of the solid-state imaging device 1.

FIG. 1 is a perspective view illustrating a configuration of a solid-state imaging device 1. FIG. 2 is a cross-sectional view illustrating the configuration of the solid-state imaging device 1. The solid-state imaging device 1 has a configuration in which a second substrate 20 is disposed on a package 30 and a first substrate 10 is disposed on the second substrate 20. A plurality of photodiodes 11 are two-dimensionally arranged and formed on the first substrate 10. The photodiode 11 may be made of a compound semiconductor, such as InGaAs, for example. A plurality of pixel circuits 21 are two-dimensionally arranged and formed on the second substrate 20. The pixel circuit 21 may be made of silicon.

The photodiodes 11 and CTIAs 50 (to be described below) of the pixel circuits 21 have a one-to-one correspondence. That is, the CTIA 50 is provided for each pixel. The first substrate 10 and the second substrate 20 are disposed to face each other, and the photodiode 11 and the pixel circuit 21 corresponding to each other are electrically connected to each other by a bump 41. Via the bump 41, each photodiode 11 is supplied with a reference voltage, and outputs charges generated according to the amount of incident light to the pixel circuit 21. Electrodes 22 formed on the second substrate 20 and electrodes 32 formed on the package 30 are electrically connected to each other by bonding wires 42. Via the bonding wire 42, each pixel circuit 21 is supplied with a reference voltage and a control signal, and outputs results of receiving charges from the photodiode 11 and processing for each pixel.

Figure 3:
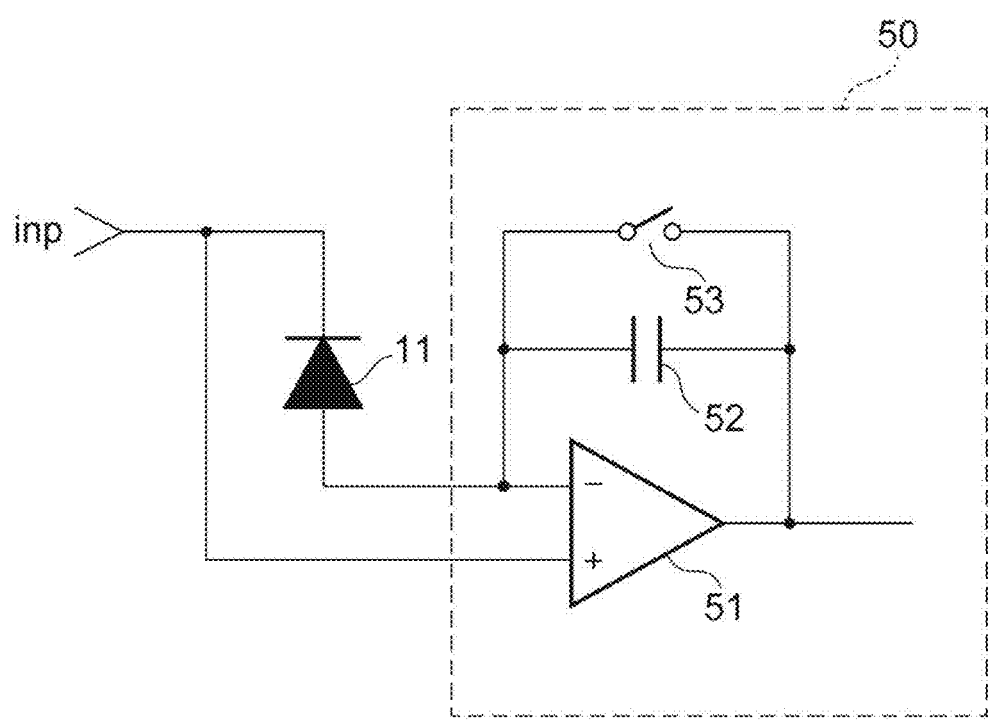
FIG. 3 is a circuit diagram illustrating a basic configuration of a photodiode 11 and a CTIA 50.

FIG. 3 is a circuit diagram illustrating a basic configuration of the photodiode 11 and the CTIA 50. The CTIA 50 includes a differential amplifier 51, an integration capacitive element 52, and a reset switch 53. The differential amplifier 51 includes a non-inverting input terminal (first input terminal), an inverting input terminal (second input terminal), and an output terminal. The integration capacitive element 52 and the switch 53 are connected in parallel to each other and are provided between the inverting input terminal and the output terminal of the differential amplifier 51. An anode of the photodiode 11 is electrically connected to the inverting input terminal of the differential amplifier 51. An inp voltage is input to a cathode of the photodiode 11 and the non-inverting input terminal of the differential amplifier 51. Since the inverting input terminal and the non-inverting input terminal of the differential amplifier 51 are in an imaginary short relationship, a potential difference between the two input terminals is substantially zero. Therefore, since the photodiode 11 is driven with a substantially zero reverse bias voltage, it is possible to suppress a dark current.

The differential amplifier 51, the integration capacitive element 52, and the switch 53 constitute a capacitive transimpedance amplifier (CTIA). When the switch 53 is in an ON state, the integration capacitive element 52 is discharged, and a voltage value output from the output terminal of the differential amplifier 51 becomes an initial value. When the switch 53 is in an OFF state, charges are accumulated in the integration capacitive element 52 according to a signal output from the photodiode 11, and a voltage value according to an amount of accumulated charges is output from the output terminal of the differential amplifier 51. In addition, the switch 53 can be configured by a MOS transistor.

Figure 4:
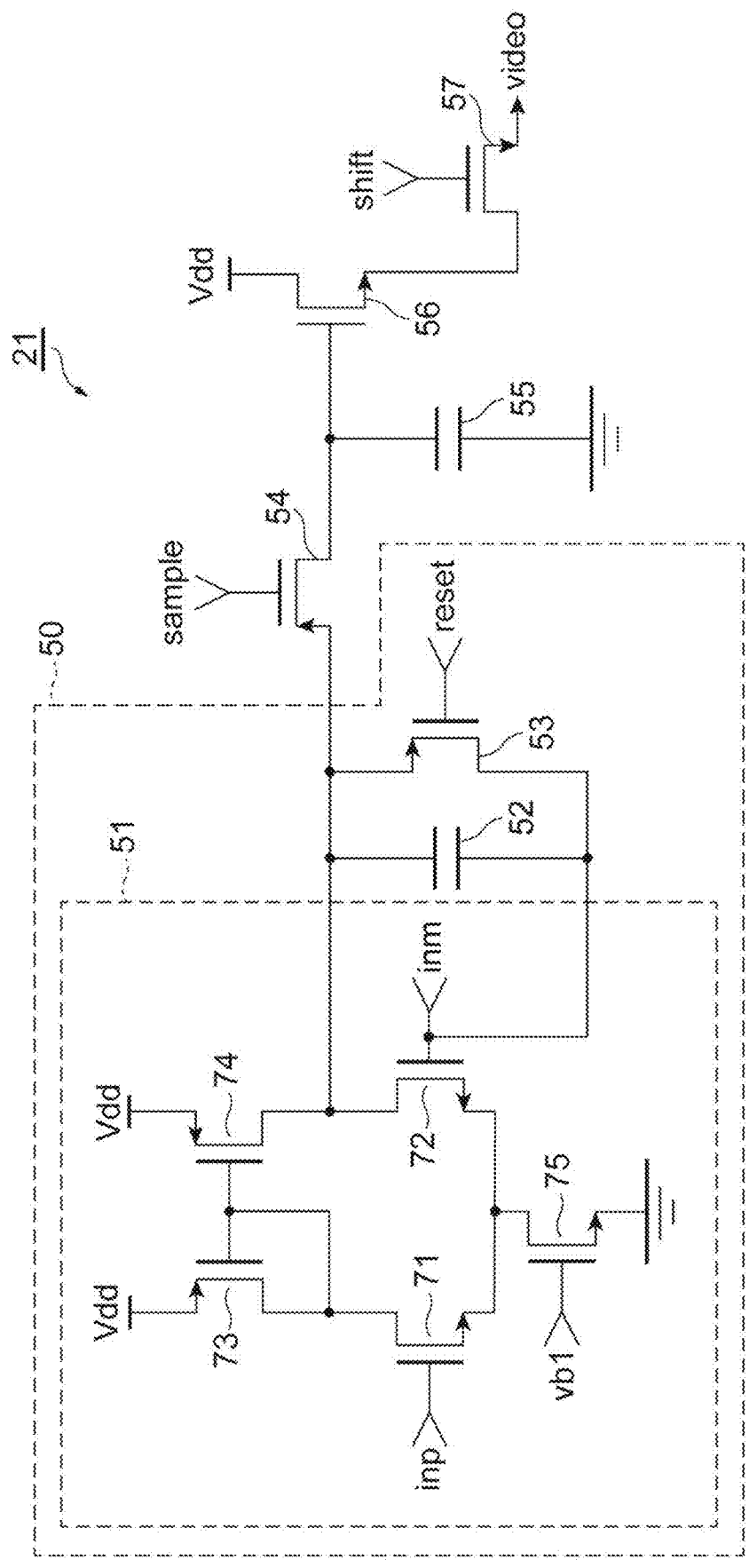
FIG. 4 is a circuit diagram illustrating a detailed configuration of a pixel circuit 21.

FIG. 4 is a circuit diagram illustrating a detailed configuration of the pixel circuit 21. The pixel circuit 21 illustrated in this figure includes a PMOS transistor 54 as a sampling switch, a capacitive element 55 for sample and hold, an NMOS transistor 56 constituting a source follower circuit, and an NMOS transistor 57 as an output selection switch, in addition to the CTIA 50 including the differential amplifier 51, the integration capacitive element 52, and the switch 53. In addition, this figure illustrates the circuit configuration of the differential amplifier 51, which will be described below with reference to FIG. 5.

A source of the PMOS transistor 54 is connected to the output terminal of the differential amplifier 51. A drain of the PMOS transistor 54 is connected to one terminal of the capacitive element 55. The other terminal of the capacitive element 55 is set to a reference potential (ground potential). In the PMOS transistor 54, an ON/OFF operation between the source and the drain is controlled by a sample signal that is input to a gate. When the PMOS transistor 54 is changed from an ON state to an OFF state, the voltage value output from the output terminal of the differential amplifier 51 immediately before is held by the capacitive element 55.

The NMOS transistor 56 and the NMOS transistor 57 are connected in series between a reference potential input terminal and a video line. A drain of the NMOS transistor 56 is set to a reference potential (power supply potential Vdd). A source of the NMOS transistor 56 is connected to a drain of the NMOS transistor 57. A source of the NMOS transistor 57 is connected to the video line. The NMOS transistor 56 receives the voltage value held in the capacitive element 55 by a gate, and has a resistance value corresponding to the voltage value between the drain and the source. In the NMOS transistor 57, an ON/OFF operation between the source and the drain is controlled by a shift signal that is input to a gate. When the NMOS transistor 57 enters an ON state, a signal according to the voltage value held in the capacitive element 55 is output to the video line.

The pixel circuit 21 is provided for each pixel. A plurality of pixel circuits 21 are connected to a signal processing circuit by the common video line. The respective NMOS transistors 57 of the plurality of pixel circuits 21 connected to the common video line are sequentially turned ON. The signal processing circuit selectively receives a signal output from the pixel circuit 21 in which the NMOS transistor 57 is in the ON state among the plurality of pixel circuits 21 connected to the common video line, and processes the input signal.

Figure 5:
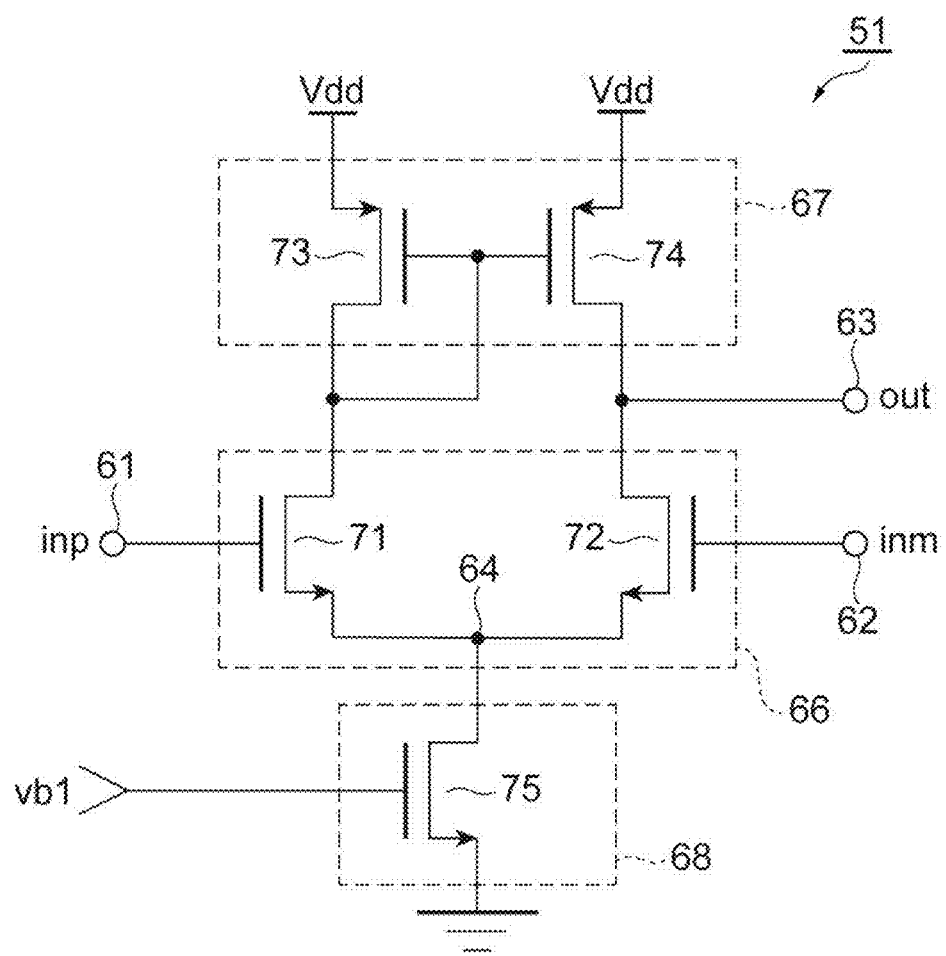
FIG. 5 is a circuit diagram of a differential amplifier 51.

FIG. 5 is a circuit diagram of the differential amplifier 51. The differential amplifier 51 includes a non-inverting input terminal (first input terminal) 61, an inverting input terminal (second input terminal) 62, and an output terminal 63. The differential amplifier 51 includes an input differential pair 66 including an NMOS transistor (first MOS transistor) 71 and an NMOS transistor (second MOS transistor) 72, a current mirror pair 67 including a PMOS transistor (third MOS transistor) 73 and a PMOS transistor (fourth MOS transistor) 74, and a constant current source 68 including an NMOS transistor (fifth MOS transistor) 75.

The NMOS transistor 71 and the NMOS transistor 72 have the same configuration. Sources of the NMOS transistors 71 and 72 are connected to a common node 64. A gate of the NMOS transistor 71 is connected to the non-inverting input terminal 61. A gate of the NMOS transistor 72 is connected to the inverting input terminal 62.

The PMOS transistor 73 and the PMOS transistor 74 have the same configuration. A first reference voltage (power supply potential Vdd) is input to sources of the PMOS transistors 73 and 74. A drain of the PMOS transistor 73 is connected to a drain of the NMOS transistor 71. A drain of the PMOS transistor 74 is connected to a drain of the NMOS transistor 72 and the output terminal 63. Gates of the PMOS transistors 73 and 74 are connected to the drain of the PMOS transistor 73.

A second reference voltage (ground potential) is input to a source of the NMOS transistor 75. A drain of the NMOS transistor 75 is connected to the common node 64. A third reference voltage (bias voltage vb1) is input to a gate of the NMOS transistor 75.

In the differential amplifier 51 having the above circuit configuration, a threshold voltage of each of the NMOS transistors 71 and 72 is higher than a threshold voltage of the NMOS transistor 75.

In this way, it is possible to suppress decrease in the output range of the differential amplifier 51 even when the power supply voltage is decreased due to adoption of the fine CMOS process. Further, the above configuration is also suitable for reduction in a pitch of the pixel circuit 21 including the differential amplifier 51 since a circuit scale (the number of transistors) of the differential amplifier 51 does not change.

Further, in the pixel circuit 21 having the above circuit configuration, the threshold voltage of each of the NMOS transistors 71 and 72 is higher than threshold voltages of other NMOS transistors (specifically, the NMOS transistor (sixth MOS transistor) 56 and the NMOS transistor (seventh MOS transistor) 57) other than the NMOS transistor 75 included in the pixel circuit 21.

In this way, it is possible to suppress decrease in the output range of the differential amplifier 51 even when the power supply voltage is decreased due to adoption of the fine CMOS process. Further, the above configuration is also suitable for reduction in a pitch of the pixel circuit 21 including the differential amplifier 51 since a circuit scale (the number of transistors) of the differential amplifier 51 does not change.

Next, a reason for decrease in the output range of the differential amplifier 51 being suppressed by making the threshold voltage of each of the NMOS transistors 71 and 72 higher than the threshold voltage of the other NMOS transistor will be described below.

Various parameters and the like of the NMOS transistors are as follows. A voltage value of the common node 64 is denoted by p1. An input voltage value of the non-inverting input terminal 61 is denoted by inp. The threshold voltage is denoted by $V_{th}$. A gate width is denoted by W. A gate length is denoted by L. A drain current is denoted by $I_d$. A carrier mobility is denoted by μ. A capacitance value per unit area of an insulating layer under the gate is denoted by $C_{ox}$. A work function of the gate is denoted by $\Phi_G$. A work function of a semiconductor is denoted by $\Phi_S$. A permittivity of the semiconductor is denoted by $\varepsilon_S$. An elementary charge is denoted by q. An impurity concentration in a channel region under the gate is denoted by $N_A$. Further, a Fermi potential is denoted by $\phi_P$. Between these parameters, there is a relationship of the following Formula (1) and Formula (2).

[Formula 1]

$$p1 = inp - V_{th} - \sqrt{\frac{2L \cdot I_d}{W \cdot \mu \cdot C_{OX}}} \quad (1)$$

[Formula 2]

$$V_{th} = \Phi_G - \Phi_S + \frac{\sqrt{2\varepsilon_s \cdot q \cdot N_A \cdot (2\varphi_P)}}{C_{ox}} + 2\varphi_P \quad (2)$$

The voltage value output from the output terminal 63 of the differential amplifier 51 is limited to a range from the input voltage value inp of the non-inverting input terminal 61 to the voltage value p1 of the common node 64. Therefore, since the voltage value p1 of the common node 64 can be reduced when the threshold voltage $V_{th}$ of each of the NMOS transistors 71 and 72 is increased, it is possible to increase the output range of the differential amplifier 51.

The impurity concentration $N_A$ in the channel region may be increased in order to increase the threshold voltage $V_{th}$. That is, the impurity concentration $N_A$ in the channel region under the gate of the NMOS transistor for which the threshold voltage $V_{th}$ is to be increased may be set to be higher than those of the other NMOS transistors.

Further, a conductivity type or an impurity concentration may be different between the gate of the NMOS transistor for which the threshold voltage $V_{th}$ is to be increased and the gate of the other NMOS transistor. That is, a difference ($\Phi_G - \Phi_S$) between the work function $\Phi_G$ of the gate and the work function $\Phi_S$ of the semiconductor in the above Formula (2) depends on the conductivity type and the impurity concentration of the gate. It is possible to increase the threshold voltage $V_{th}$ by increasing this difference ($\Phi_G - \Phi_S$). In addition, in general, a polysilicon is used as a gate material.

In the case of the NMOS transistor, it is possible to increase the threshold voltage $V_{th}$ by changing the gate made of polysilicon from the N-type to the P-type. When the gate of the NMOS transistor is of the N-type, it is possible to increase the threshold voltage $V_{th}$ by reducing the impurity concentration. When the gate of the NMOS transistor is of the P-type, it is possible to increase the threshold voltage $V_{th}$ by increasing the impurity concentration. On the other hand, in the case of the PMOS transistor, it is possible to increase the threshold voltage $V_{th}$ by changing the gate made of polysilicon from the P-type to the N-type. When the gate of the PMOS transistor is of the N-type, it is possible to increase the threshold voltage $V_1$ by increasing the impurity concentration. When the gate of the PMOS transistor is of the P-type, it is possible to increase the threshold voltage $V_{th}$ by reducing the impurity concentration.

Further, the capacitance value $C_{ox}$ per unit area of the insulating layer under the gate of the NMOS transistor for which the threshold voltage $V_{th}$ is to be increased may be decreased. Specifically, a material having a low relative permittivity may be used as the insulating layer under the gate, or the insulating layer may be thickened, in order to increase the threshold voltage $V_{th}$.

Further, the threshold voltage of the NMOS transistor 75 may be higher than the threshold voltages of the NMOS transistors 56 and 57. The respective threshold voltages of the NMOS transistors 71, 72, and 75 may be approximately the same. A current I flowing through the NMOS transistor 75 is expressed by the following Formula (3) using a voltage $V_{gs}$ between the gate and the source of the NMOS transistor 75, that is, the bias voltage vb1. As can be seen from this formula, when values of other parameters are the same, and the threshold voltage $V_{th}$ of the NMOS transistor 75 is high, the current I decreases. However, when the bias voltage vb1 is also increased so that the difference ($V_{gs} - V_{th}$) does not change, the current I can also be kept unchanged. That is, in the case in which the threshold voltage $V_{th}$ of the NMOS transistor 75 is increased, it is possible to suppress decrease in the output range of the differential amplifier 51 when the bias voltage vb1 is increased. In addition, a magnitude of the bias voltage vb1 can be arbitrarily set according to a circuit design. A specific method of increasing the threshold voltage of the NMOS transistor 75 is as described above.

[Formula 3]

$$I = \frac{W/L \cdot \mu \cdot C_{OX} \cdot (V_{gs} - V_{th})^2}{2} \quad (3)$$

Figure 6:
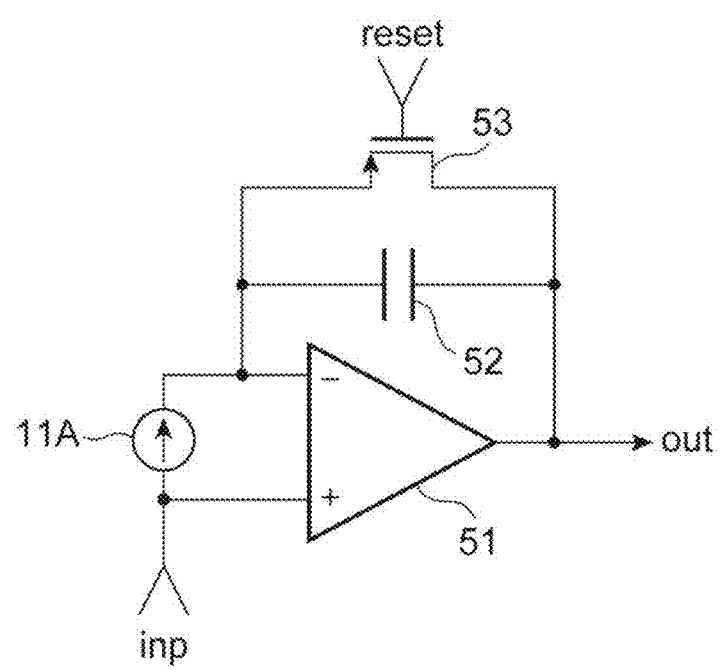
FIG. 6 is a diagram illustrating a configuration of a circuit used in a simulation.

Next, simulation results will be described. FIG. 6 is a diagram illustrating a configuration of a circuit used in a simulation. A simulation circuit illustrated in this figure uses a constant current source 11A in place of the photodiode 11 in the circuit illustrated in FIG. 3. That is, this constant current source 11A imitates a photodiode that generates a constant amount of charges over time.

Figure 7:
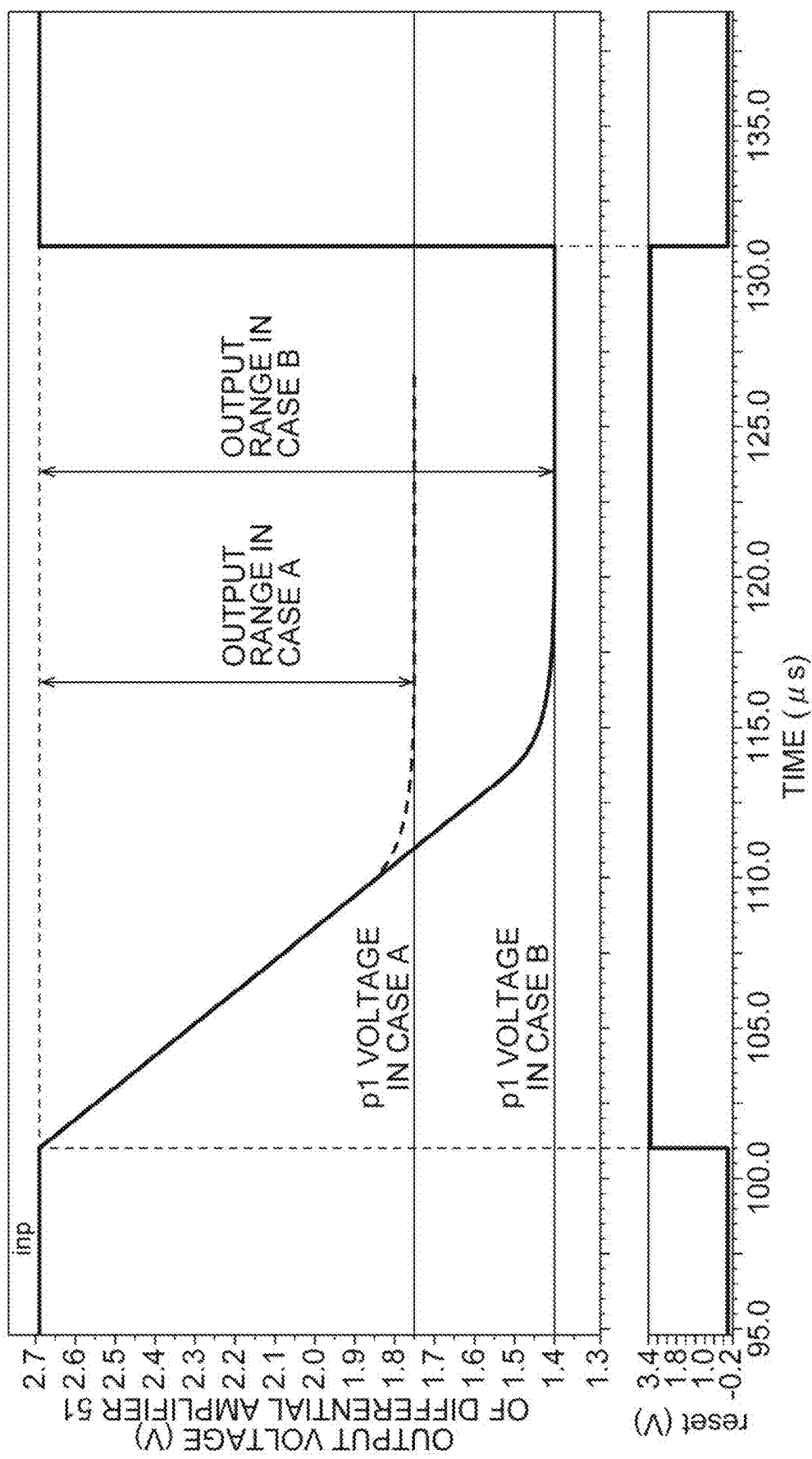
FIG. 7 is a graph illustrating simulation results.

FIG. 7 is a graph illustrating the simulation results. Two cases A and B were assumed for the simulation. In the case A, the respective threshold voltages of the NMOS transistors 71, 72, 75, 56, and 57 were set to 0.65 V. In the case B, the respective threshold voltages of the NMOS transistors 71 and 72 were set to 1.00 V, and the respective threshold voltages of the NMOS transistors 75, 56 and 57 were set to 0.65 V. The input voltage value inp of the non-inverting input terminal was set to 2.7 V. An output current value of the constant current source 11A was set to 3 nA. An ON period of the switch 53 was set to 30 μs. A capacitance value of the integration capacitive element 52 was set to 30 pF.

In the case A in which the threshold voltages of the NMOS transistors 71 and 72 are the same as the threshold voltages of the other NMOS transistors, the voltage value output from the output terminal of the differential amplifier 51 is from 2.7 V to 1.75 V. In the case B in which the threshold voltages of the NMOS transistors 71 and 72 are higher than the threshold voltages of the other NMOS transistors, the voltage value output from the output terminal of the differential amplifier 51 is from 2.7 V to 1.4 V. It is confirmed that the output range is larger in the case B than in the case A. A difference in the output range between the case A and the case B is 0.35 V, which is the same as a difference in the threshold voltage.

The present invention is not limited to the above embodiment and configuration examples, and various modifications are possible. For example, in the above embodiment, the first conductivity type is the N-type and the second conductivity type is the P-type, and on the other hand, the first conductivity type may be the P-type and the second conductivity type may be the N-type.

Further, although the case in which the differential amplifier is used as one component of the pixel circuit in the solid-state imaging device has been described in the above embodiment, the differential amplifier can also be used in other circuits.

The differential amplifier according to the above embodiment is a differential amplifier including a first input terminal, a second input terminal, and an output terminal, and includes (1) an input differential pair including a first MOS transistor and a second MOS transistor of a first conductivity type, sources of the first MOS transistor and the second MOS transistor being connected to a common node, a gate of the first MOS transistor being connected to the first input terminal, and a gate of the second MOS transistor being connected to the second input terminal, (2) a current mirror pair including a third MOS transistor and a fourth MOS transistor of a second conductivity type, a first reference voltage being input to sources of the third MOS transistor and the fourth MOS transistor, a drain of the third MOS transistor being connected to a drain of the first MOS transistor, a drain of the fourth MOS transistor being connected to a drain of the second MOS transistor and the output terminal, and gates of the third MOS transistor and the fourth MOS transistor being connected to the drain of the third MOS transistor, and (3) a constant current source including a fifth MOS transistor of the first conductivity type, a second reference voltage being input to a source of the fifth MOS transistor, a drain of the fifth MOS transistor being connected to the common node, and a third reference voltage being input to a gate of the fifth MOS transistor, and (4) a threshold voltage of each of the first MOS transistor and the second MOS transistor is higher than a threshold voltage of the fifth MOS transistor.

In the differential amplifier of the above configuration, an impurity concentration in a channel region under the gate of each of the first MOS transistor and the second MOS transistor may be higher than an impurity concentration in a channel region under the gate of the fifth MOS transistor.

Further, in the differential amplifier of the above configuration, a conductivity type or an impurity concentration may be different between the gate of each of the first MOS transistor and the second MOS transistor and the gate of the fifth MOS transistor.

The pixel circuit according to the above embodiment includes the differential amplifier of the above configuration, and an integration capacitive element provided between the second input terminal and the output terminal of the differential amplifier and for accumulating charges according to a signal input to the second input terminal, and a signal having a value according to an amount of accumulated charges in the integration capacitive element is output from the output terminal of the differential amplifier.

The solid-state imaging device according to the above embodiment includes the pixel circuit of the above configuration, and a photodiode, and the pixel circuit inputs a signal output according to light reception from the photodiode to the second input terminal of the differential amplifier, and outputs an output signal having a value according to an amount of received light from the output terminal of the differential amplifier.

In the solid-state imaging device of the above configuration, a plurality of photodiodes may be formed on a first substrate, a plurality of pixel circuits may be formed on a second substrate, and the first substrate and the second substrate may be disposed to face each other.

The pixel circuit according to the above embodiment includes a differential amplifier including a first input terminal, a second input terminal, and an output terminal, and an integration capacitive element provided between the second input terminal and the output terminal of the differential amplifier and for accumulating charges according to a signal input to the second input terminal, the pixel circuit outputting a signal having a value according to an amount of accumulated charges in the integration capacitive element from the output terminal of the differential amplifier, and the differential amplifier includes (1) an input differential pair including a first MOS transistor and a second MOS transistor of a first conductivity type, sources of the first MOS transistor and the second MOS transistor being connected to a common node, a gate of the first MOS transistor being connected to the first input terminal, and a gate of the second MOS transistor being connected to the second input terminal, (2) a current mirror pair including a third MOS transistor and a fourth MOS transistor of a second conductivity type, a first reference voltage being input to sources of the third MOS transistor and the fourth MOS transistor, a drain of the third MOS transistor being connected to a drain of the first MOS transistor, a drain of the fourth MOS transistor being connected to a drain of the second MOS transistor and the output terminal, and gates of the third MOS transistor and the fourth MOS transistor being connected to the drain of the third MOS transistor, and (3) a constant current source including a fifth MOS transistor of the first conductivity type, a second reference voltage being input to a source of the fifth MOS transistor, a drain of the fifth MOS transistor being connected to the common node, and a third reference voltage being input to a gate of the fifth MOS transistor, and (4) a threshold voltage of each of the first MOS transistor and the second MOS transistor is higher than a threshold voltage of another MOS transistor of the first conductivity type other than the fifth MOS transistor included in the pixel circuit.

In the pixel circuit of the above configuration, an impurity concentration in a channel region under the gate of each of the first MOS transistor and the second MOS transistor may be higher than an impurity concentration in a channel region under the gate of the other MOS transistor.

Further, in the pixel circuit of the above configuration, a conductivity type or an impurity concentration may be different between the gate of each of the first MOS transistor and the second MOS transistor and the gate of the other MOS transistor.

In the pixel circuit of the above configuration, a threshold voltage of the fifth MOS transistor may be higher than the threshold voltage of the other MOS transistor. In this case, an impurity concentration in a channel region under the gate of the fifth MOS transistor may be higher than an impurity concentration in a channel region under the gate of the other MOS transistor. Further, a conductivity type or an impurity concentration may be different between the gate of the fifth MOS transistor and the gate of the other MOS transistor.

The pixel circuit of the above configuration may be configured to include, as the other MOS transistor, a sixth MOS transistor of the first conductivity type including a gate to which a signal output from the output terminal of the differential amplifier is input and constituting a source follower circuit, and a seventh MOS transistor of the first conductivity type connected in series with the sixth MOS transistor.

The solid-state imaging device according to the above embodiment includes the pixel circuit of the above configuration, and a photodiode, and the pixel circuit inputs a signal output according to light reception from the photodiode to the second input terminal of the differential amplifier, and outputs an output signal having a value according to an amount of received light from the output terminal of the differential amplifier.

In the solid-state imaging device of the above configuration, a plurality of photodiodes may be formed on a first substrate, a plurality of pixel circuits may be formed on a second substrate, and the first substrate and the second substrate may be disposed to face each other.

INDUSTRIAL APPLICABILITY

The present invention can be used as a differential amplifier, a pixel circuit, and a solid-state imaging device capable of reducing a pitch of the pixel circuits and suppressing decrease in an output range.

REFERENCE SIGNS LIST

1—solid-state imaging device, 10—first substrate, 11—photodiode, 20—second substrate, 21—pixel circuit, 22—electrode, 30—package, 32—electrode, 41—bump, 42—bonding wire, 50—CTIA, 51—differential amplifier, 52—integration capacitive element, 53—switch, 54—PMOS transistor, 55—capacitive element, 56—NMOS transistor (sixth MOS transistor), 57—NMOS transistor (seventh MOS transistor), 61—non-inverting input terminal (first input terminal), 62—inverting input terminal (second input terminal), 63—output terminal, 64—common node, 66—input differential pair, 67—current mirror pair, 68—constant current source, 71—NMOS transistor (first MOS transistor), 72—NMOS transistor (second MOS transistor), 73—PMOS transistor (third MOS transistor), 74—PMOS transistor (fourth MOS transistor), 75—NMOS transistor (fifth MOS transistor).

The invention claimed is:

1. A differential amplifier including a first input terminal, a second input terminal, and an output terminal, the differential amplifier comprising:
an input differential pair including a first MOS transistor and a second MOS transistor of a first conductivity type, sources of the first MOS transistor and the second MOS transistor being connected to a common node, a gate of the first MOS transistor being connected to the first input terminal, and a gate of the second MOS transistor being connected to the second input terminal;
a current mirror pair including a third MOS transistor and a fourth MOS transistor of a second conductivity type, a first reference voltage being input to sources of the third MOS transistor and the fourth MOS transistor, a drain of the third MOS transistor being connected to a drain of the first MOS transistor, a drain of the fourth MOS transistor being connected to a drain of the second MOS transistor and the output terminal, and gates of the third MOS transistor and the fourth MOS transistor being connected to the drain of the third MOS transistor; and
a constant current source including a fifth MOS transistor of the first conductivity type, a second reference voltage being input to a source of the fifth MOS transistor, a drain of the fifth MOS transistor being connected to the common node, and a third reference voltage being input to a gate of the fifth MOS transistor, wherein
a threshold voltage of each of the first MOS transistor and the second MOS transistor is higher than a threshold voltage of the fifth MOS transistor, and
an impurity concentration in a channel region under the gate of each of the first MOS transistor and the second MOS transistor is higher than an impurity concentration in a channel region under the gate of the fifth MOS transistor.

2. The differential amplifier according to claim 1, wherein a conductivity type or an impurity concentration is different between the gate of each of the first MOS transistor and the second MOS transistor and the gate of the fifth MOS transistor.

3. A pixel circuit comprising:
the differential amplifier according to claim 1; and
an integration capacitive element provided between the second input terminal and the output terminal of the differential amplifier and configured to accumulate charges according to a signal input to the second input terminal, wherein
a signal having a value according to an amount of accumulated charges in the integration capacitive element is output from the output terminal of the differential amplifier.

4. A solid-state imaging device comprising:
the pixel circuit according to claim 3; and
a photodiode, wherein
the pixel circuit inputs a signal output according to light reception from the photodiode to the second input terminal of the differential amplifier, and outputs an output signal having a value according to an amount of received light from the output terminal of the differential amplifier.

5. The solid-state imaging device according to claim 4, wherein a plurality of photodiodes are formed on a first substrate, a plurality of pixel circuits are formed on a second substrate, and the first substrate and the second substrate are disposed to face each other.

6. A pixel circuit comprising a differential amplifier including a first input terminal, a second input terminal, and an output terminal; and an integration capacitive element provided between the second input terminal and the output terminal of the differential amplifier and configured to accumulate charges according to a signal input to the second input terminal, the pixel circuit outputting a signal having a value according to an amount of accumulated charges in the integration capacitive element from the output terminal of the differential amplifier, wherein
the differential amplifier comprises:
an input differential pair including a first MOS transistor and a second MOS transistor of a first conductivity type, sources of the first MOS transistor and the second MOS transistor being connected to a common node, a gate of the first MOS transistor being connected to the first input terminal, and a gate of the second MOS transistor being connected to the second input terminal;
a current mirror pair including a third MOS transistor and a fourth MOS transistor of a second conductivity type, a first reference voltage being input to sources of the third MOS transistor and the fourth MOS transistor, a drain of the third MOS transistor being connected to a drain of the first MOS transistor, a drain of the fourth MOS transistor being connected to a drain of the second MOS transistor and the output terminal, and gates of the third MOS transistor and the fourth MOS transistor being connected to the drain of the third MOS transistor; and a constant current source including a fifth MOS transistor of the first conductivity type, a second reference voltage being input to a source of the fifth MOS transistor, a drain of the fifth MOS transistor being connected to the common node, and a third reference voltage being input to a gate of the fifth MOS transistor, and wherein the pixel circuit further comprises a sixth MOS transistor of the first conductivity type including a gate to which a signal output from the output terminal of the differential amplifier is input and constituting a source follower circuit, and a seventh MOS transistor of the first conductivity type connected in series with the sixth MOS transistor, and a threshold voltage of each of the first MOS transistor and the second MOS transistor is higher than a threshold voltage of each of the sixth MOS transistor and the seventh MOS transistor.

7. The pixel circuit according to claim 6, wherein an impurity concentration in a channel region under the gate of each of the first MOS transistor and the second MOS transistor is higher than an impurity concentration in a channel region under the gate of each of the sixth MOS transistor and the seventh MOS transistor.

8. The pixel circuit according to claim 6, wherein a conductivity type or an impurity concentration is different between the gate of each of the first MOS transistor and the second MOS transistor and the gate of each of the sixth MOS transistor and the seventh MOS transistor.

9. The pixel circuit according to claim 6, wherein a threshold voltage of the fifth MOS transistor is higher than the threshold voltage of each of the sixth MOS transistor and the seventh MOS transistor.

10. The pixel circuit according to claim 9, wherein an impurity concentration in a channel region under the gate of the fifth MOS transistor is higher than an impurity concentration in a channel region under the gate of each of the sixth MOS transistor and the seventh MOS transistor.

11. The pixel circuit according to claim 9, wherein a conductivity type or an impurity concentration is different between the gate of the fifth MOS transistor and the gate of each of the sixth MOS transistor and the seventh MOS transistor.

12. A solid-state imaging device comprising:
the pixel circuit according to claim 6; and
a photodiode, wherein
the pixel circuit inputs a signal output according to light reception from the photodiode to the second input terminal of the differential amplifier, and outputs an output signal having a value according to an amount of received light from the output terminal of the differential amplifier.

13. The solid-state imaging device according to claim 12, wherein a plurality of photodiodes are formed on a first substrate, a plurality of pixel circuits are formed on a second substrate, and the first substrate and the second substrate are disposed to face each other.

14. A differential amplifier including a first input terminal, a second input terminal, and an output terminal, the differential amplifier comprising:
an input differential pair including a first MOS transistor and a second MOS transistor of a first conductivity type, sources of the first MOS transistor and the second MOS transistor being connected to a common node, a gate of the first MOS transistor being connected to the first input terminal, and a gate of the second MOS transistor being connected to the second input terminal;

a current mirror pair including a third MOS transistor and a fourth MOS transistor of a second conductivity type, a first reference voltage being input to sources of the third MOS transistor and the fourth MOS transistor, a drain of the third MOS transistor being connected to a drain of the first MOS transistor, a drain of the fourth MOS transistor being connected to a drain of the second MOS transistor and the output terminal, and gates of the third MOS transistor and the fourth MOS transistor being connected to the drain of the third MOS transistor; and a constant current source including a fifth MOS transistor of the first conductivity type, a second reference voltage being input to a source of the fifth MOS transistor, a drain of the fifth MOS transistor being connected to the common node, and a third reference voltage being input to a gate of the fifth MOS transistor, wherein a threshold voltage of each of the first MOS transistor and the second MOS transistor is higher than a threshold voltage of the fifth MOS transistor, and a conductivity type or an impurity concentration is different between the gate of each of the first MOS transistor and the second MOS transistor and the gate of the fifth MOS transistor.

15. A pixel circuit comprising:
the differential amplifier according to claim 14; and
an integration capacitive element provided between the second input terminal and the output terminal of the differential amplifier and configured to accumulate charges according to a signal input to the second input terminal, wherein
a signal having a value according to an amount of accumulated charges in the integration capacitive element is output from the output terminal of the differential amplifier.

16. A solid-state imaging device comprising:
the pixel circuit according to claim 15; and
a photodiode, wherein
the pixel circuit inputs a signal output according to light reception from the photodiode to the second input terminal of the differential amplifier, and outputs an output signal having a value according to an amount of received light from the output terminal of the differential amplifier.

17. The solid-state imaging device according to claim 16, wherein a plurality of photodiodes are formed on a first substrate, a plurality of pixel circuits are formed on a second substrate, and the first substrate and the second substrate are disposed to face each other.

* * * * *